United States Patent
Chang et al.

(10) Patent No.: US 10,074,514 B1
(45) Date of Patent: Sep. 11, 2018

(54) APPARATUS AND METHOD FOR IMPROVED ION BEAM CURRENT

(71) Applicant: Varian Semiconductor Equipment Associates, Inc., Gloucester, MA (US)

(72) Inventors: Shengwu Chang, South Hamilton, MA (US); Frank Sinclair, Boston, MA (US); Alexandre Likhanskii, Malden, MA (US); Philip Layne, Salem, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/699,255

(22) Filed: Sep. 8, 2017

(51) Int. Cl.
*H01J 37/317* (2006.01)

(52) U.S. Cl.
CPC . *H01J 37/3171* (2013.01); *H01J 2237/30405* (2013.01); *H01J 2237/31701* (2013.01)

(58) Field of Classification Search
USPC .................................................. 250/492.21
See application file for complete search history.

(56) References Cited

U.S. PATENT DOCUMENTS

2012/0097861 A1* 4/2012 White ................. H01J 3/04
250/397

* cited by examiner

Primary Examiner — Kiet T Nguyen (57) ABSTRACT

An apparatus may include an electrode system, the electrode system comprising a plurality of electrodes to guide an ion beam from an entrance aperture to an exit aperture, and a voltage supply to apply a plurality of voltages to the electrode system. The electrode system may comprise an exit electrode assembly, where the exit electrode assembly includes a first exit electrode and a second exit electrode, separated from the first exit electrode by an electrode gap. The first exit electrode and the second exit electrode may be movable with respect to one another so as to change a size of the electrode gap over a gap range.

20 Claims, 6 Drawing Sheets

APPARATUS AND METHOD FOR IMPROVED ION BEAM CURRENT

FIELD OF THE DISCLOSURE

The disclosure relates generally to apparatus and techniques for ion implantation and more particularly, to improving current delivered to a substrate after deceleration of an ion beam.

BACKGROUND OF THE DISCLOSURE

Ion implantation is a process for introducing dopants, additives, or impurities into a substrate via bombardment. Known ion implantation systems or apparatus may comprise an ion source and a series of beam-line components. The ion source may comprise a chamber where desired ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage.

In known ion implanters, a final deceleration stage may decelerate an ion beam as well as shape the ion beam and change the direction of propagation of the ion beam before impacting the substrate. A deceleration stage may be designed as an electrode system having a plurality of electrodes where different voltages are applied to guide the ion beam, shape the ion beam, and decelerate the ion beam, before exiting the deceleration stage. In known deceleration stages, the beam may be guided between opposing pairs of electrodes that define a gap region where the ion beam may propagate while not striking the electrodes. For low energy ion beams, the beam height of the ion beam in a direction perpendicular to the direction of propagation tends to be greater. Thus, in known ion implanters, a deceleration stage may be designed with a gap between opposing electrodes that is adequate to accommodate a beam height for a lowest ion energy to be employed in the ion implanter.

Because the gap between electrodes may be designed for a lowest energy ion beam, for ion beams having a higher energy, the ion beam may proceed through a deceleration stage and in particular through a pair of exit electrodes, where the ion beam is spaced apart from the opposing electrodes. This configuration may lead to non-ideal results, including a lower beam current to deliver to a substrate for a given beam height.

With respect to these and other considerations, the present disclosure is provided.

SUMMARY

In one embodiment, an apparatus may include an electrode system, the electrode system comprising a plurality of electrodes to guide an ion beam from an entrance aperture to an exit aperture, and a voltage supply to apply a plurality of voltages to the electrode system. The electrode system may comprise an exit electrode assembly, where the exit electrode assembly includes a first exit electrode and a second exit electrode, separated from the first exit electrode by an electrode gap. The first exit electrode and the second exit electrode may be movable with respect to one another so as to change a size of the electrode gap over a gap range.

In another embodiment, a system for ion implantation may include an ion source, arranged to generate an ion beam. The system may further include an electrode system, the electrode system comprising a plurality of electrodes to guide the ion beam from an entrance aperture to an exit aperture. The system may also include a voltage supply to apply a plurality of voltages to the electrode system, wherein the electrode system further includes an exit electrode assembly. The exit electrode assembly may include a first exit electrode and a second exit electrode, separated from the first exit electrode by an electrode gap, wherein the first exit electrode and the second exit electrode are movable with respect to one another so as to change a size of the electrode gap over a gap range.

In a further embodiment, a method may include generating an ion beam; decelerating the ion beam in an electrode system, wherein the ion beam is directed to a substrate; and adjusting an electrode gap between exit electrodes of the electrode system, based upon a beam height of the ion beam.

The drawings are not necessarily to scale. The drawings are merely representations, not intended to portray specific parameters of the disclosure. The drawings are intended to depict typical embodiments of the disclosure, and therefore are not to be considered as limiting in scope. In the drawings, like numbering represents like elements.

DETAILED DESCRIPTION

A system, apparatus and method in accordance with the present disclosure will now be described more fully hereinafter with reference to the accompanying drawings, where embodiments of the system, apparatus and method are shown. The system, apparatus and method may be embodied in many different forms and are not to be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

In various embodiments, systems, apparatus, and methods are provided for controlling the trajectory of an ion beam in a novel manner to facilitate cleaning of components in an ion beam apparatus.

Figure 1A:
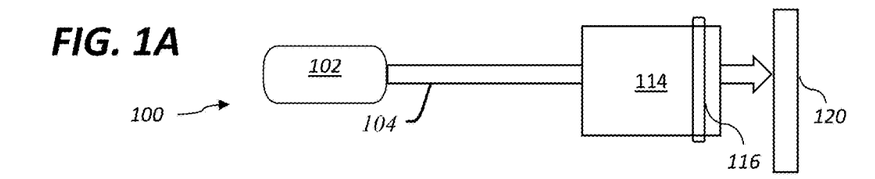
FIG. 1A and FIG. 1B present a block diagram of an apparatus according to embodiments of the disclosure.
Figure 1B:
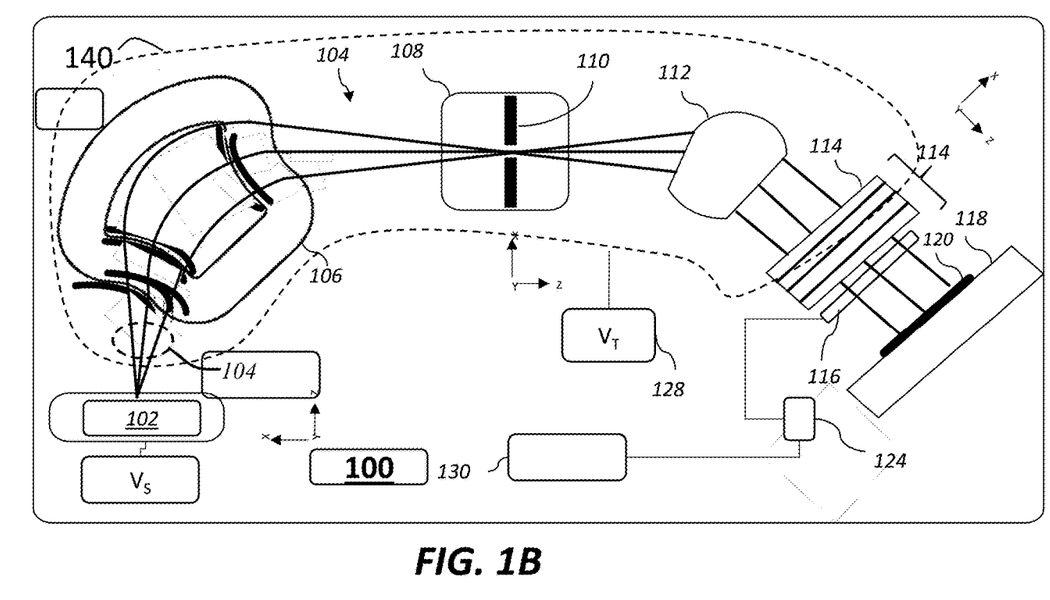

FIG. 1A and FIG. 1B present a block diagram of an ion implantation system 100 according to embodiments of the disclosure. The ion implantation system 100 may be termed an "ion implanter," and may generally represent a beamline ion implanter or a compact apparatus generating an ion beam. Accordingly, various known components of ion implanter may be omitted for clarity. As illustrated, the ion implantation system 100 includes an ion beam source, shown as ion source 102. The ion source 102 may also comprise a power source and an extraction electrode assembly (not shown) disposed near a chamber of the ion source 102.

The ion source 102 may include a power generator, plasma exciter, plasma chamber, and the plasma. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art.

The ion source 102 may generate an ion beam 104 for processing a substrate 120. In various embodiments the ion beam (in cross-section) may have a targeted shape, such as a spot beam or ribbon beam, as known in the art. In the coordinate system shown, the direction of propagation of an ion beam may be represented as parallel to the Z-axis, while the actual trajectories of ions with the ion beam 104 may vary. In order to process the substrate 120, the ion beam 104 may be accelerated to acquire a target energy by establishing a voltage (potential) difference between the ion source 102 and substrate 120. As shown in FIG. 1B, the ion source 102 may be coupled to a voltage supply 132, designed to generate a targeted ion energy for ions during processing of the substrate 120. Examples of ion energy for processing a substrate may range from several hundred eV to hundreds of thousands of eV. The embodiments are not limited in this context.

In a processing mode of operation, the ion implantation system 100 may be employed to process the substrate 120 by establishing a plasma in ion source 102, applying the positive voltage $V_T$ to ion source 102, and extracting the ion beam 104 while the substrate 120 is maintained at ground potential. This difference defines the process energy, the energy of the ions when the ions reach the substrate. In order to make the transport of the ion beam 104 more efficient through the mass selection and beam shaping stages, this process may advantageously be maintained an higher energy. In one implementation, this higher energy may be achieved by applying a negative voltage $V_T$ to a portion 140 that houses the elements that perform mass analysis and beam shaping so that the beam has an energy established by $V_S+V_T$ for most of the beam path length. This arrangement causes the ion beam 104 to be decelerated to the substrate 120 as shown in FIG. 1B. In various embodiments, the ion beam 104 may be provided as a ribbon beam, a spot beam, or a scanned spot beam. As shown in FIG. 1A, the ion beam 104 may traverse an electrode system 114 that acts as a deceleration stage to reduce the ion energy of ion beam 104, before impinging on the substrate 120. The electrode system 114 may include an exit electrode assembly 116, where the operation of exit electrode assembly 116 is detailed below.

FIG. 1B illustrates a variant of the ion implantation system 100, including various beamline components as detailed below. The beam-line components may include, for example, a mass analyzer 106, a chamber 108 including mass slit 110, a collimator 112, electrode system 114 for treating the ion beam 104 as detailed below, and a substrate stage 118. The electrode system 114 may be coupled to electrode a voltage supply 128, to receive various voltages at different electrodes within the electrode system 114, as detailed below. The voltage supply 128 may bias the portion 140, as noted, and may additionally supply different voltages to the different electrodes of the electrode system 114 to perform different functions such as suppression, deceleration, and so forth. The ion implantation system 100 may further include a drive system 124 coupled to the exit electrode assembly 116, to adjust a gap between electrodes as detailed below. The ion implantation system 100 may further include a controller 130, coupled at least to the drive system 124, providing a control signal to adjust the positioning of electrodes in the exit electrode assembly 116. The controller 130 may allow an operator to enter user input that is received by the controller, and according may facilitate remote control and adjustment of the positions of electrodes within the electrode assembly, avoiding disabling operation of an ion implantation system.

In exemplary embodiments, the aforementioned beam-line components may filter, focus, and manipulate the ion beam 104 to have a desired species, shape, trajectory, energy, and other qualities. The substrate 120 via substrate stage 118 may be moved in one or more dimensions (e.g., translate, rotate, and tilt).

Figure 2:
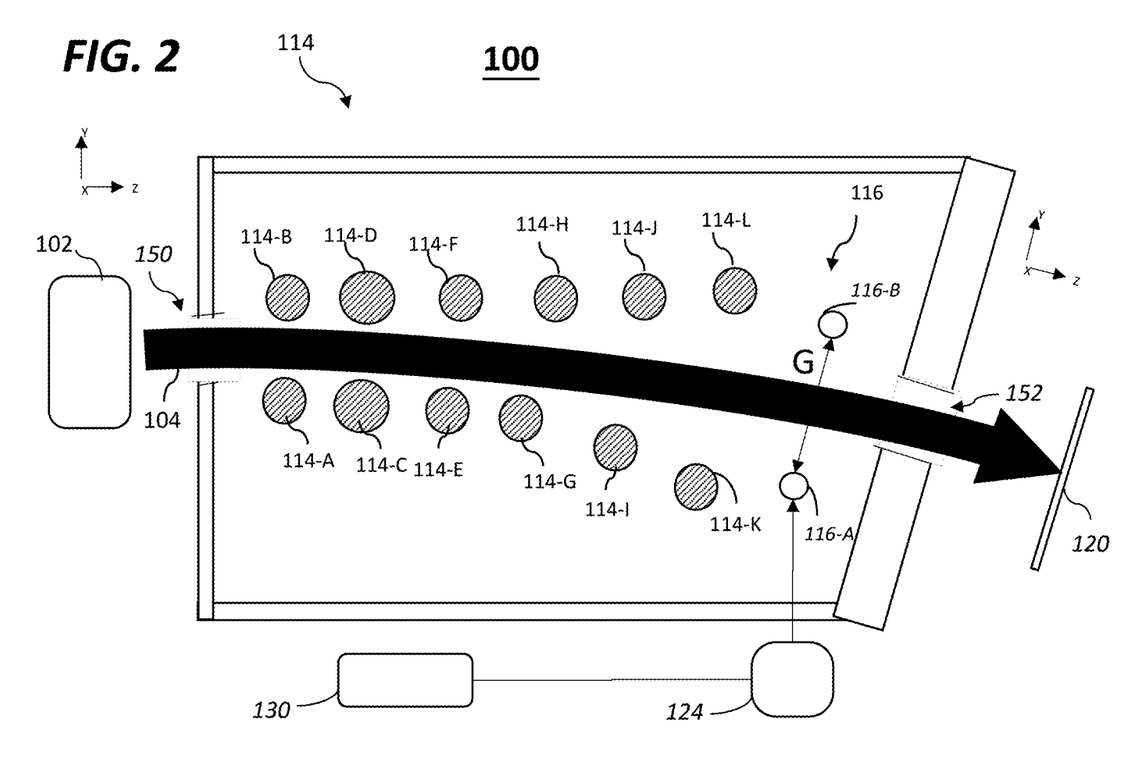
FIG. 2 shows an exemplary embodiment of a system in accordance with the present disclosure.

FIG. 2 provides an additional depiction of the ion implantation system 100, providing details of an embodiment of the electrode system 114. The electrode system 114 may act as a deceleration stage to reduce the energy of the ion beam 104 as the ion beam traverses from an entrance aperture 150 to an exit aperture 152. The trajectory of the ion beam 104 may also be changed as illustrated to filter out species such as energetic neutrals, as in known electrostatic filters. The ion beam 104 may also be shaped by electrodes of the electrode system 114, so as to conduct the ion beam 104 through the exit aperture 152 and direct the ion beam 104 to the substrate 120. In particular, the electrode system 114 may include a plurality of electrodes, arranged in pairs, so as to define a spacing to conduct the ion beam 104. Various electrodes are shown as electrodes 114-A, 114-B, 114-C, 114-D, 114-E, 114-F, 114-G, 114-H, 114-I, 114-J, 114-K, and 114-L, where at least some electrodes may be arranged as suppression electrodes and deceleration electrodes, as in known deceleration stages. For example, the electrodes 114-E-114-L may act as deceleration electrodes. The exit electrode assembly 116 may include a first exit electrode 116-A and a second exit electrode 116-B, disposed adjacent to exit aperture 152 and upstream of exit aperture 152. In various non-limiting embodiments, the first exit electrode 116-A and a second exit electrode 116-B may be ground electrodes, where the potential applied to the first exit electrode 116-A and a second exit electrode 116-B is ground potential.

In some embodiments, the electrodes 114-A to 114-L include pairs of conductive pieces, such as rods or other elongated (along the X-axis) structures, electrically coupled to each other. Alternatively, the electrodes 114-A to 114-L may be a series of unitary structures, each including an aperture for the ion beam to pass therethrough. In the embodiment shown, upper and lower portions of each electrode pair may have different potentials (e.g., in separate conductive pieces) in order to deflect the ion beam passing therethrough. While the electrodes 114-A to 114-L are depicted as seven (7) pairs (e.g., with five (5) sets of suppression/focusing electrodes), any number of elements (or electrodes) may be utilized in various embodiments. For example, the configuration of electrodes 114-A to 114-L may utilize a range of three (3) to ten (10) electrode sets.

In various embodiments, the first exit electrode 116-A and second exit electrode 116-B may be separate electrodes that are independently movable with respect to one another.

Figure 3A:
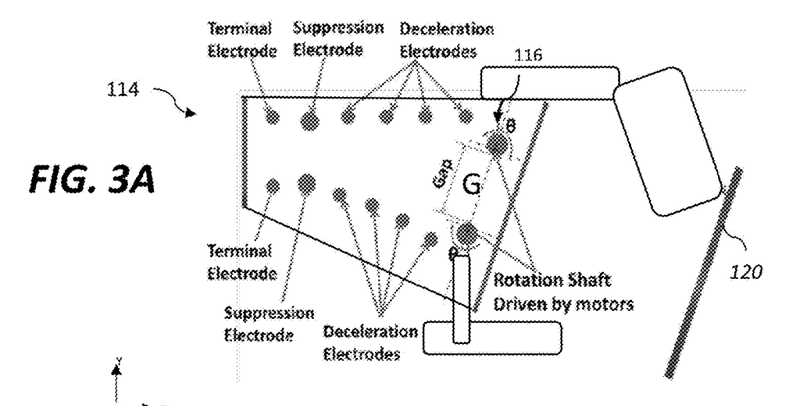
FIG. 3A-3C shows a side view of one variant of the electrode system of FIG. 2 in operation.
Figure 3B:
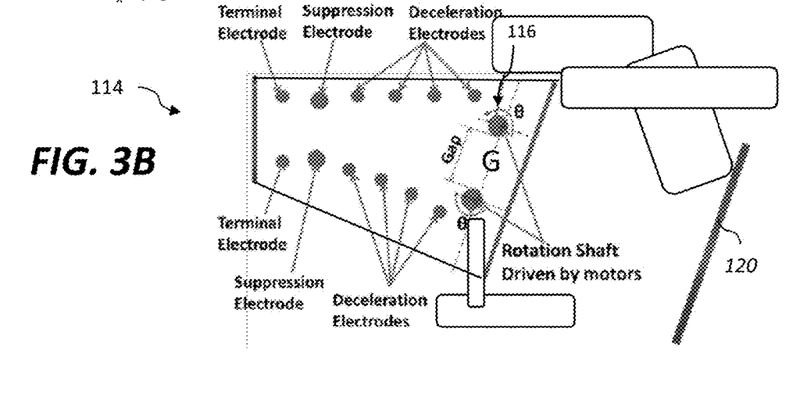
Figure 3C:
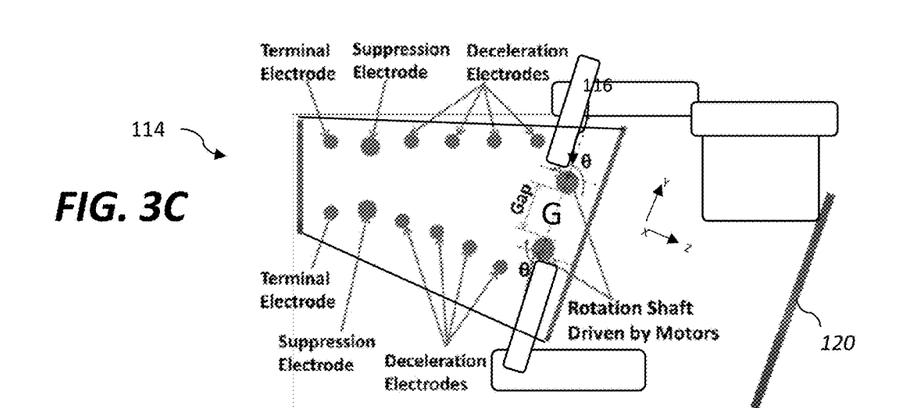

As shown in FIG. 2, the second exit electrode 116-B is separated from the first exit electrode 116-A by an electrode gap G, wherein the first exit electrode 116-A and the second exit electrode 116-B are movable with respect to one another so as to change a size of the electrode gap G over a gap range. Turning now to FIG. 3A, FIG. 3B, and FIG. 3C there is shown the operation of the electrode system 114, according to some embodiments of the disclosure. The configuration of the first exit electrode 116-A and the second exit electrode 116-B are changed between the different views shown in FIG. 3A, FIG. 3B, and FIG. 3C. In particular, the first exit electrode 116-A and the second exit electrode 116-B are rotated in successive 90 degree increments (θ) about a rotation axis between successive figures. This rotation allows the electrode gap G to be adjusted as explained below in detail with respect to FIG. 3D and FIG. 3E. As an example, FIG. 3A may correspond to a rotation angular position of θ=0° where the electrode gap G is at a maximum, which value may correspond to 98 mm in one embodiment. FIG. 3B shows a rotation angular position θ=90° where the electrode gap G may be 80.3 mm. FIG. 3C shows a rotation angular position θ=180° where the electrode gap G may be at a minimum of 63 mm. In this example, the gap range is 35 mm while in other examples the gap range may be at least 25 mm. The embodiments are not limited in this context.

Figure 3D:
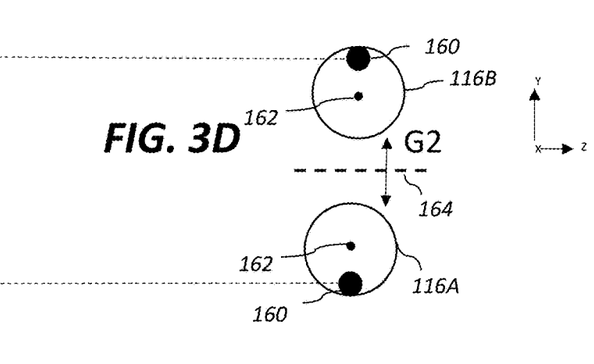
FIG. 3D and FIG. 3E depict details of operation of an exit electrode assembly, according to embodiments of the disclosure.
Figure 3E:
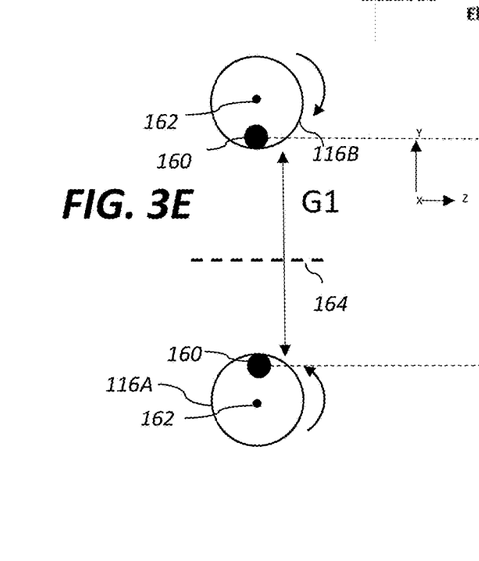

FIG. 3D and FIG. 3E depict details of operation of the exit electrode assembly 116, according to embodiments of the disclosure. In various embodiments, the first exit electrode 116-A and second exit electrode 116-B may comprise a shaft, such as a rod, that extends along the X-axis of the coordinate system shown. In the example of FIG. 3D, the first exit electrode 116A and the second exit electrode 116B exhibit a shaft center 162 as shown. The first exit electrode 116A and the second exit electrode 116B also include a rotation axis 160, where the rotation axis 160 is displace from the shaft center 162. For example, a smaller diameter rod may extend through a given exit electrode to define the rotation axis as shown, so the given exit electrode does not rotate about the shaft center 162. The first exit electrode 116-A and the second exit electrode 116-B may be mechanically coupled to a motor (see drive system 124) that supplies a rotational motion to the first exit electrode 116-A and the second exit electrode 116-B. In some embodiments, the motor may supply a drive motion that rotates first exit electrode 116-A in a counterclockwise rotation and the second exit electrode 116-B in a clockwise rotation. In some embodiments, the counterclockwise rotation and the clockwise rotation may be driven to take place simultaneously to one another. In this manner, the rotation of first exit electrode 116-A and the second exit electrode 116-B may cause the electrode gap between the first exit electrode 116-A and second exit electrode 116-B to decrease from a largest dimension of G1 to a smallest dimension of G2. In particular, in the example shown in FIG. 3D and FIG. 3E, the first exit electrode 116-A and the second exit electrode 116-B undergo a 180-degree rotation about the rotation axis 160. Rotation through a smaller angle, such as shown in FIG. 3B, results in an electrode gap of intermediate size between G1 and G2. By providing a simultaneous symmetric rotation of first exit electrode 116-A and second exit electrode 116-B, the electrode gap may be symmetrically changed about the centerline 164 between first exit electrode 116-A and second exit electrode 116-B.

The gap range for adjusting the electrode gap G in the above example is merely exemplary and may be greater or smaller depending upon the size of exit electrodes and placement of rotation axis, for example. In other embodiments, the electrode gap between exit electrodes may be adjusted using a drive that changes the electrode gap between exit electrodes by imparting a linear motion to the exit electrodes along the Y-axis.

Figure 4A:
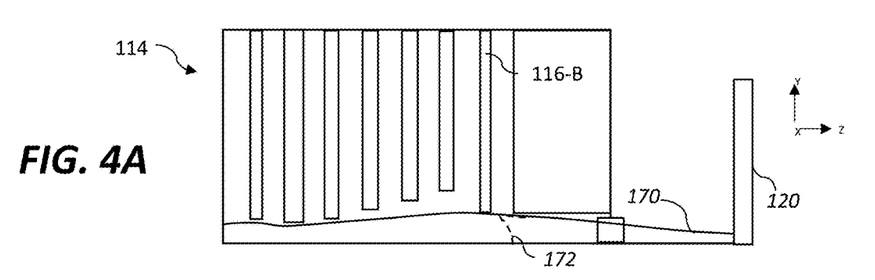
FIG. 4A, FIG. 4B, and FIG. 4C depict simulated beam current profiles for operation of an electrode system according to embodiments of the disclosure.
Figure 4B:
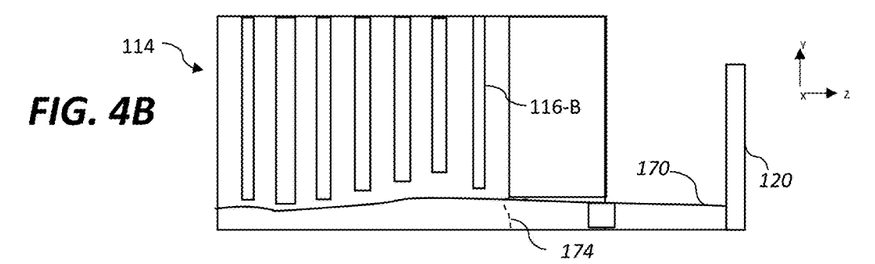
Figure 4C:
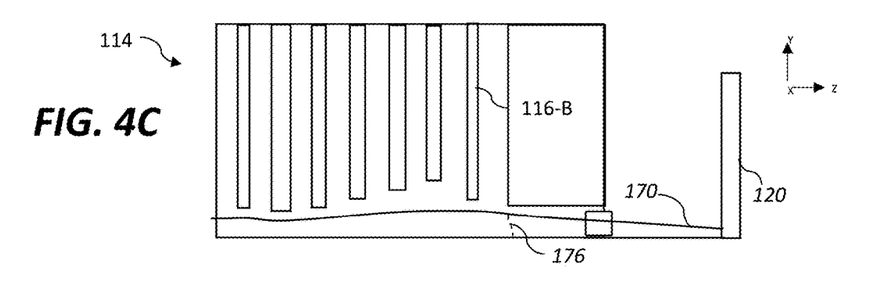

FIG. 4A, FIG. 4B, and FIG. 4C depict simulated beam current profiles for operation of an electrode system according to embodiments of the disclosure. The figures depict a cross section of an ion beam 170 traversing an electrode system 114, where a given rectangle represents an electrode having a uniform electric potential within the rectangle. The figures depict a top half of the electrode system 114, where the bottom half is symmetrical with respect to the top half and is omitted for clarity. In this simulation, a 3 keV P$^+$ beam is transported through the electrode system 114, which system includes a pair of movable exit electrodes, held at ground potential. In the simulations of FIGS. 4A-4C the final beam energy is 3 keV, while the voltage applied to the terminal electrode (furthest electrode to the left, next to the entrance aperture) is −30 kV, and the voltage applied to the suppression electrode (see FIGS. 3A-3C for position of suppression electrode) is −50 kV.

In FIG. 4A, just one electrode, exit electrode 116-B, is shown. A beam current (ROI) is measured on a substrate 120, such as a 300 mm wafer. In FIG. 4A, the exit electrodes as exemplified by exit electrode 116-B, are moved to the position where the electrode gap between the exit electrodes is 76 mm, where the ion beam 170 is just touching exit electrode 116-B. In this configuration, the electrode system 114 can focus and transport a 27.6 mA 3 keV P$^+$ beam to the substrate. FIG. 4A also shows a plasma boundary 172, having a useful, concave shape for focusing and transporting the ion beam 170 (3 keV) through the electrode system 114 to substrate 120. As such, the ion beam 170 forms a narrow beam having a small height along the Y-axis when impinging on the substrate 120. Turning now to FIG. 4B, there is shown a configuration where the electrode gap between the exit electrodes is adjusted to be 98 mm. Notably, this configuration corresponds to the fixed electrode gap exhibited in some known ion implantation systems. Such a relatively greater electrode gap may be useful so that low energy ion beams having energy as low as 500 eV may be conducted to a substrate with a reasonable beam current. A disadvantage of providing such a wide, fixed electrode gap, is exhibited in FIG. 4B for the 3 keV P+ beam. In FIG. 4B, the ion beam 170 is simulated for the same current of 27.6 mA and same beam energy of 3 keV P+ as in FIG. 4A. In this configuration, the ion beam 170 is conducted to the substrate 120 while not being focused so a taller beam strikes the substrate 120. FIG. 4B also shows the plasma boundary 174, which boundary is flattened and shifted downstream with respect to the plasma boundary 172 of FIG. 4A. The distortion of the plasma boundary reduces the focusing of ion beam 170 at the exit of the electrode system 114. The shift of the plasma boundary to the downstream also increases the beam space charge expansion. Both of the beam focusing reduction and the beam space charge expansion tend to reduce the transmission of the low energy beam through the electrode system 114 to substrate 120.

FIG. 4C illustrates another scenario where the electrode gap between exit electrodes is 98 mm. In this case, the current transported into the electrode system 114 is reduced, so that a beam of 21.4 mA 3 keV P+ beam current is conducted to the substrate 120. In this example, while the plasma boundary 176 is moved downstream with respect to the plasma boundary 172 of FIG. 4A, at the reduced beam current, the ion beam 170 can be focused to a shorter beam at the substrate 120, comparable in beam height to the scenario of FIG. 4A.

The above results of FIGS. 4A-4C show that a plasma boundary can be optimized for focusing and transporting a low energy ion beam by adjusting the electrode gap between the exit electrodes of exit electrode assembly 116. In particular, adjusting the electrode gap between the electrodes so that the beam height is equal to the electrode gap G between exit electrode 116-A and exit electrode 116-B generates a plasma boundary having the appropriate concave shape and proper location for maximizing the low energy beam transmission through the electrode system 114. In particular, the results show that a 3 keV P+ beam current may be increased by 30% with respect to known fixed electrode configuration having a wide electrode gap such as 98 mm.

Figure 5:
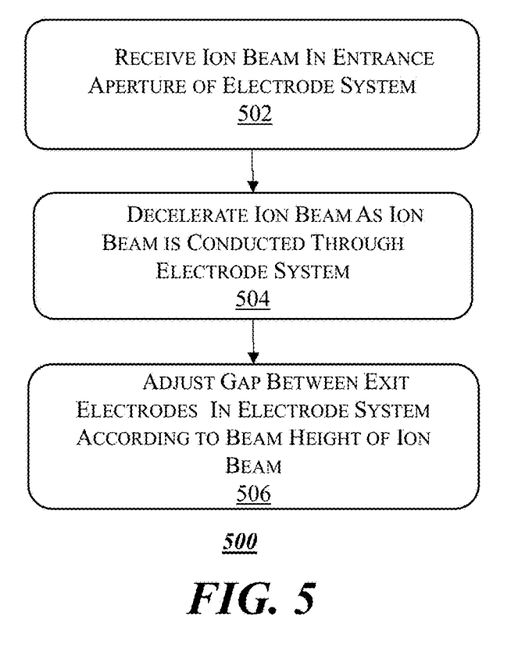
FIG. 5 shows an exemplary process flow according to embodiments of the disclosure.

FIG. 5 shows an exemplary process flow 500 according to embodiments of the disclosure. At block 502 an ion beam is received at the entrance aperture of an electrode system. In various embodiments, the ion beam may be a ribbon beam or a scanned spot beam. The electrode system may act as a deceleration stage in some embodiments. In some embodiments, the ion beam may comprise an ion energy of 30 keV or less, and in particular embodiments, an ion energy of 10 keV or less.

At block 504, the ion beam may be decelerated as the ion beam is conducted through the electrode system. As such the electrode system may include multiple pairs of opposing electrodes, configured to guide the ion beam, as well as decelerate the ion beam. The electrode system may include a pair of exit electrodes, where the exit electrodes are the most downstream of electrodes within the electrode system. In embodiments where no other acceleration or deceleration stages are present between the electrode system and a substrate, pair of exit electrodes may be ground electrodes.

At block 506, an electrode gap between exit electrodes is adjusted in the electrode system according to the beam height of the ion beam. The beam height may represent the size of the beam along a line extending between a first exit electrode and a second exit electrode of a pair of exit electrodes. In some embodiments, the electrode gap may be adjusted to equal the beam height. In particular embodiments, the exit electrodes may be configured as rods, where the electrode gap may be adjusted by rotating the rods about a rotation axis of each rod that is spaced apart from the center of the rod.

In view of the foregoing, at least the following advantages are achieved by the embodiments disclosed herein. Firstly, an electrode configuration within a deceleration stage constructed according to the present embodiments may be conveniently adjusted by an operator without having to remove the deceleration stage and without manual adjustment. Secondly, low energy ion beams having energy as low as several hundred eV may be accommodated within a deceleration stage while also transmitting high beam current with proper focus at higher ion energies.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, while the present disclosure has been described herein in the context of a particular implementation in a particular environment for a particular purpose, those of ordinary skill in the art will recognize the usefulness of the present embodiments is not limited thereto and the present embodiments may be beneficially implemented in any number of environments for any number of purposes. Thus, the claims set forth below are to be construed in view of the full breadth of the present disclosure as described herein.

The invention claimed is:

1. An apparatus, comprising:
an electrode system, the electrode system comprising a plurality of electrodes to guide an ion beam from an entrance aperture to an exit aperture; and
a voltage supply to apply a plurality of voltages to the electrode system,
wherein the electrode system comprises an exit electrode assembly, the exit electrode assembly comprising a first exit electrode and a second exit electrode, separated from the first exit electrode by an electrode gap, wherein the first exit electrode and the second exit electrode are movable with respect to one another so as to change a size of the electrode gap over a gap range.

2. The apparatus of claim 1, further comprising a motor, the motor being mechanically coupled to the exit electrode assembly and supplying a linear motion to the exit electrode assembly.

3. The apparatus of claim 1, further comprising a controller to supply a control signal to adjust the electrode gap, responsive to user input.

4. The apparatus of claim 1, wherein the first exit electrode and the second exit electrode comprising a shaft, wherein the shaft comprises a shaft center, and wherein the shaft is rotatable about a rotation axis, the rotation axis being displaced from the shaft center.

5. The apparatus of claim 4, wherein rotation about the rotation axis changes the size of the electrode gap.

6. The apparatus of claim 1, the gap range being at least 25 mm.

7. The apparatus of claim 1, the electrode gap comprising a maximum value of 98 mm and a minimum value of 63 mm.

8. The apparatus of claim 1, the electrode system further comprising a plurality of deceleration electrodes, the plurality of deceleration electrodes being disposed upstream of the exit electrode assembly, closer to the entrance aperture.

9. A system for ion implantation, comprising:
an ion source, arranged to generate an ion beam;
an electrode system, the electrode system comprising a plurality of electrodes to guide the ion beam from an entrance aperture to an exit aperture; and
a voltage supply to apply a plurality of voltages to the electrode system, wherein the electrode system further comprises a exit electrode assembly, the exit electrode assembly comprising a first exit electrode and a second exit electrode, separated from the first exit electrode by an electrode gap, wherein the first exit electrode and the second exit electrode are movable with respect to one another so as to change a size of the electrode gap over a gap range.

10. The system of claim 9, further comprising a motor, the motor being mechanically coupled to the exit electrode assembly and supplying a linear motion to the exit electrode assembly.

11. The system of claim 9, further comprising a controller to supply a control signal to adjust the electrode gap, responsive to user input.

12. The system of claim 9, wherein the first exit electrode and the second exit electrode comprising a shaft, wherein the shaft comprises a shaft center, and wherein the shaft is rotatable about a rotation axis, the rotation axis being displaced from the shaft center.

13. The system of claim 12, wherein rotation about the rotation axis changes the size of the electrode gap.

14. The system of claim 9, the gap range being at least 25 mm.

15. The system of claim 9, the electrode system further comprising a plurality of deceleration electrodes, the plurality of deceleration electrodes being disposed upstream of the exit electrode assembly, closer to the entrance aperture.

16. The system of claim 9, further comprising a substrate stage, disposed downstream to the electrode system, wherein the substrate stage and the exit electrode assembly are arranged to be held at a same voltage.

17. A method, comprising:
 generating an ion beam;
 decelerating the ion beam in an electrode system, wherein the ion beam is directed to a substrate; and
 adjusting an electrode gap between exit electrodes of the electrode system, based upon a beam height of the ion beam.

18. The method of claim 17, comprising adjusting the electrode gap to equal the beam height.

19. The method of claim 17, wherein the electrode system comprises an exit electrode assembly having a first exit electrode and a second exit electrode, wherein the beam height comprises a size of the ion beam along a line extending between the first exit electrode and the second exit electrode.

20. The method of claim 19, wherein the first exit electrode and the second exit electrode comprising a shaft, wherein the shaft comprises a shaft center, wherein the adjusting the electrode gap comprises rotating the shaft of at least one of the first exit electrode and the second exit electrode about a rotation axis, the rotation axis being displaced from the shaft center.

* * * * *